(12) United States Patent
Corisis et al.

(10) Patent No.: US 6,541,856 B2
(45) Date of Patent: Apr. 1, 2003

(54) THERMALLY ENHANCED HIGH DENSITY SEMICONDUCTOR PACKAGE

(75) Inventors: David J. Corisis, Meridian, ID (US); Mike Brooks, Caldwell, ID (US); Mark S. Johnson, Boise, ID (US); Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/874,011

(22) Filed: Jun. 6, 2001

(65) Prior Publication Data

US 2002/0185729 A1 Dec. 12, 2002

(51) Int. Cl.⁷ .............................................. H01L 29/72
(52) U.S. Cl. ....................... 257/723; 257/724; 257/726; 257/787; 257/666
(58) Field of Search ................................ 257/723, 724, 257/726, 787, 666

(56) References Cited

U.S. PATENT DOCUMENTS

| | | |
|---|---|---|
| 5,177,669 A | 1/1993 | Juskey et al. |
| 5,200,809 A | 4/1993 | Kwon |
| 5,450,283 A | 9/1995 | Lin et al. |
| 5,604,376 A | 2/1997 | Hamburgen et al. |
| 5,843,807 A | 12/1998 | Burns |
| 5,894,108 A * | 4/1999 | Mostafazadeh et al. ..... 257/366 |
| 5,901,041 A | 5/1999 | Davies et al. |
| 6,049,123 A * | 4/2000 | Burns .......................... 257/686 |

* cited by examiner

*Primary Examiner*—Edward Wojciechowicz
(74) *Attorney, Agent, or Firm*—Dickstein Shapiro Morin & Oshinsky LLP

(57) ABSTRACT

A high density semiconductor package with thermally enhanced properties is described. The semiconductor package includes a pair of lead frames, each being attached to a respective semiconductor die. The dies are attached to respective lead frames via an adhering material, such as a tape. Further, the dies are each electrically connected to fingers of each lead frame. In one illustrated embodiment, the dies and portions of the fingers are encapsulated in such a way as to leave one surface of each die exposed. In another illustrated embodiment, heat dissipation for the semiconductor package occurs through exposed fingers of the lead frames which adhere semiconductor dies within a cavity located therebetween.

28 Claims, 7 Drawing Sheets

THERMALLY ENHANCED HIGH DENSITY SEMICONDUCTOR PACKAGE

FIELD OF THE INVENTION

The present invention relates to high density semiconductor packages. More particularly, the present invention relates to high density semiconductor packages and methods for making them.

BACKGROUND

Semiconductor packaging techniques are well known. In conventional packaged devices, a die is attached to a substrate, such as, for example, a lead frame, and contacts of the die and lead frame are electrically connected together. A heat sink may also be affixed to the die. The die and heat sink arc then completely encapsulated, using an overmold (a heated container with a cavity), with a molded plastic material. An example of such a conventional packaged device may be found in U.S. Pat. No. 5,901,041 (Davies et al.).

Other conventional methodologies include mounting and electrically connecting a semiconductor die to a lead frame and also incorporating heat conductive areas, such as columns, to assist in removing heat from the semiconductor die. The semiconductor die, the heat conductive columns, and a portion of the lead frame are then encapsulated. An example of such a conventional packaged device may be found in U.S. Pat. No. 5,200,809 (Kwon).

Yet other conventional methodologies include packaging the die so as to leave one surface exposed. Examples of such conventional die packages may be found in U.S. Pat. No. 5,894,108 (Mostafazadeh et al.), U.S Pat. No. 5,604,376 (Hamburgen et al.), U.S Pat. No. 5,450,283 (Lin et al.), and U.S. Pat. No. 5,177,669 (Juskey et al.).

All of the aforementioned conventional semiconductor packages include a single semiconductor die which is either partially or completely encapsulated with a molded plastic material. Other conventional semiconductor packages include more than one semiconductor die encapsulated by a molded plastic material. Examples of such high density semiconductor packages may be found in U.S. Pat. No. 5,843,807 (Burns) and U.S. Pat. No. 6,049,123 (Burns). One disadvantage of the high density semiconductor packages described in Burns is that the overall package thickness is relatively large, whereas thinner high density packages would be preferable.

What is needed is a relatively thin a high density semiconductor package which has good heat dissipation characteristics.

SUMMARY

The invention provides a relatively thin high density semiconductor package having good heat dissipation characteristics. The package includes a first and a second lead frame, each lead frame including a plurality of fingers, a first and a second semiconductor die electrically connected to the lead frames, and an encapsulating material partially encapsulating the fingers and the semiconductor dies in a manner which leaves surfaces of the semiconductor dies exposed.

The invention further provides a method of fabricating a high density semiconductor package. The method includes the acts of attaching a first semiconductor die to a first lead frame and a second semiconductor die to a second lead frame, each lead frame including a plurality of fingers, electrically commenting the fingers of the first lead frame to the first semiconductor die and the fingers of the second lead fame to the second semiconductor die, and encapsulating portions of the fingers and the semiconductor dies in a manner which leaves a surface of each semiconductor die exposed.

These and other advantages and features of the invention will be more readily understood from the following detailed description of the invention which is provided in connection with the accompanying drawings.

DETAILED DESCRIPTION OF PREFERRED EMBODIMENTS

Figure 1:
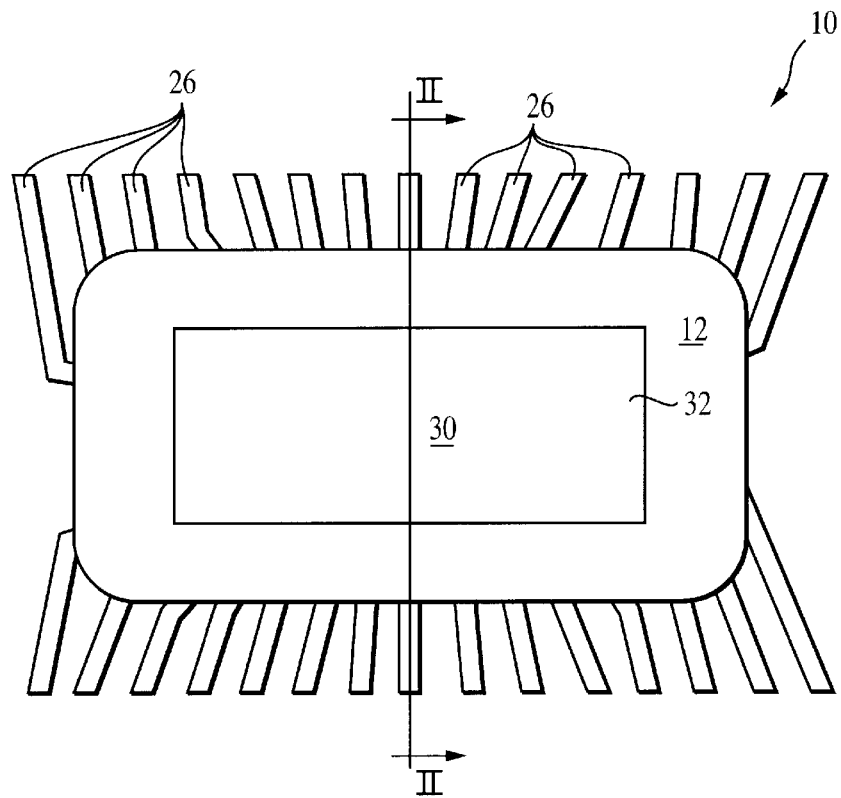
FIG. 1 is a top view of a high density semiconductor package constructed in accordance with an exemplary embodiment of the invention.
Figure 2:
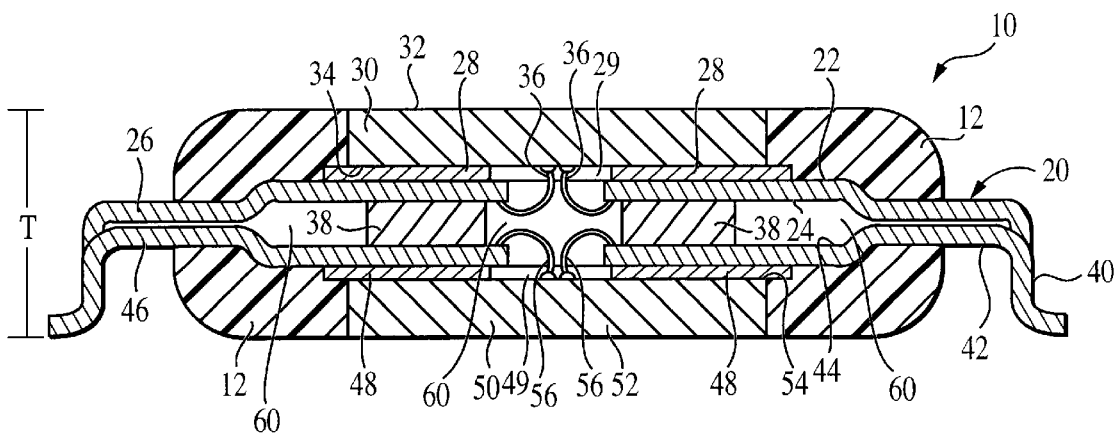
FIG. 2 is a cross-sectional view taken along line II—II of the semiconductor package of FIG. 1.

FIGS. 1–2 illustrate a high density semiconductor package 10 including a pair of semiconductor dies 30, 50 partially encapsulated within a molded plastic material 12, and a pair of lead frames 20, 40. The lead frame 20 includes a plurality of fingers 26 which have an outer surface 22 and an inner surface 24. Likewise, the lead frame 40 includes a plurality of fingers 46 extending therefrom. The lead frame 40 also has an outer surface 42 and an inner surface 44.

Each of the dies 30, 50 is attached to a respective lead frame 20, 40 through an adherinig material, such as a tape. Specifically, the die 30 may be attached to the lead frame fingers 26 via a tape 28 having an opening 29 and the die 50 is attached to the lead frame fingers 46 via a tape 48 with an opening 49. Alternatively, the tape 28, 48 may include two parallel tape portions which extend substantially the length of the dies 30, 50 and which provide ample room between the tape portions for electrically connecting the dies 30, 50 to the lead frames 20, 40 (described in detail below).

Each of the dies 30, 50 includes a plurality of bonding sites for electrical connection to respective bonding sites on the lead frame fingers 26, 46. Specifically, as illustrated in FIG. 3C, die 30 includes a plurality of bonding pads 35, each of which is wire bonded with an electrical connector 36 to a respective finger 26. Though not illustrated, it is to be understood that die 50 may be similarly connected to the fingers 46, Such as through electrical connectors 56 (FIG. 2).

Each of the dies 30, 50 has an exposed surface and an inner surface. Referring to the die 30, it includes an exposed surface 32 and an inner surface 34. The inner surface 34 is adhered to the tape 28. The die 50 has an exposed surface 52 and an inner surface 54 which is adhered to the tape 48.

One or more spacers 38 are positioned between the lead frame fingers 26, 46 to provide a cavity 60. The spacers 38 provide structural strength to the package 10 before and during encapsulation. The cavity 60 provides adequate room for the electrical connectors 36, 56. Although two spacers 38 are illustrated, it is to be understood that one, three or more spacers may be positioned between the lead frames 20, 40.

Figure 3A:
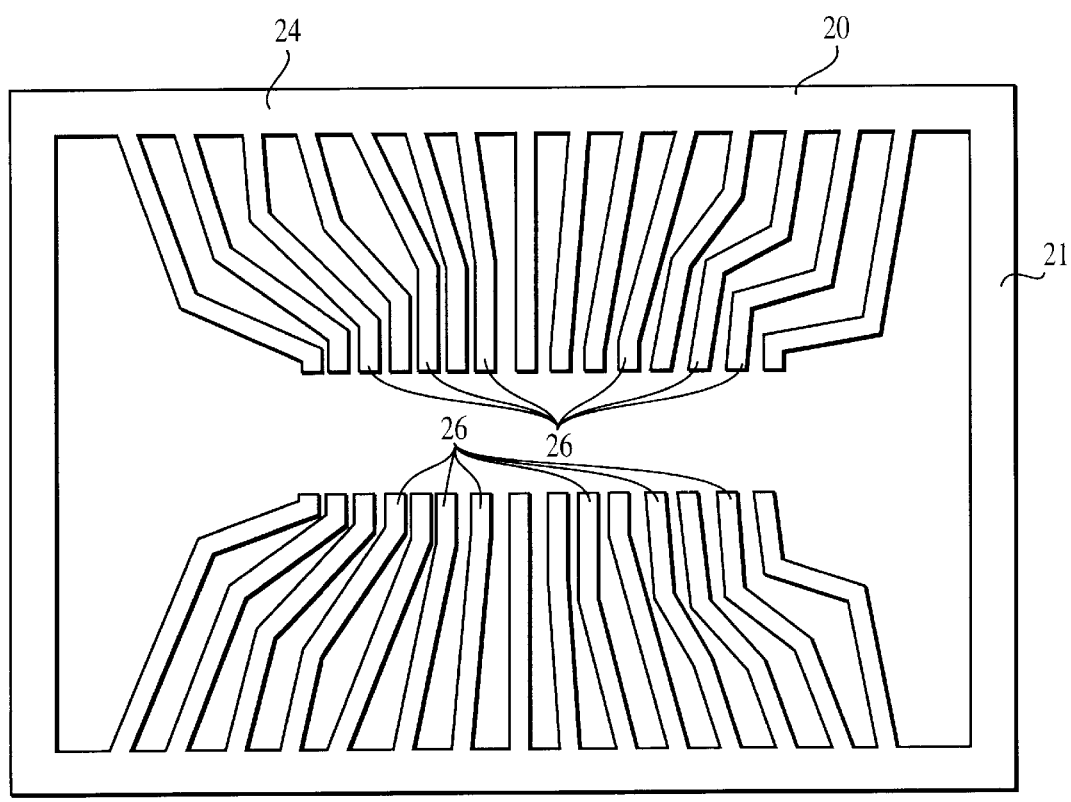
FIGS. 3A–3D illustrate various stages of assembly of the semiconductor package of FIG. 1.
Figure 3B:
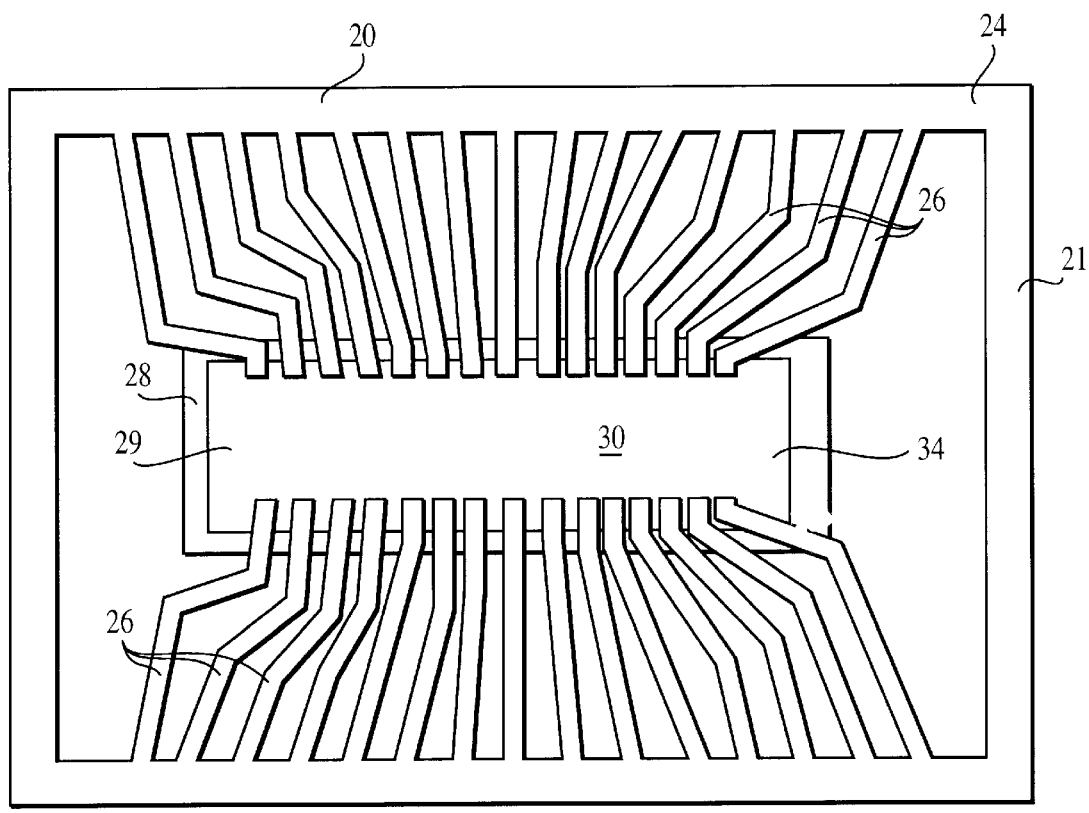
Figure 3C:
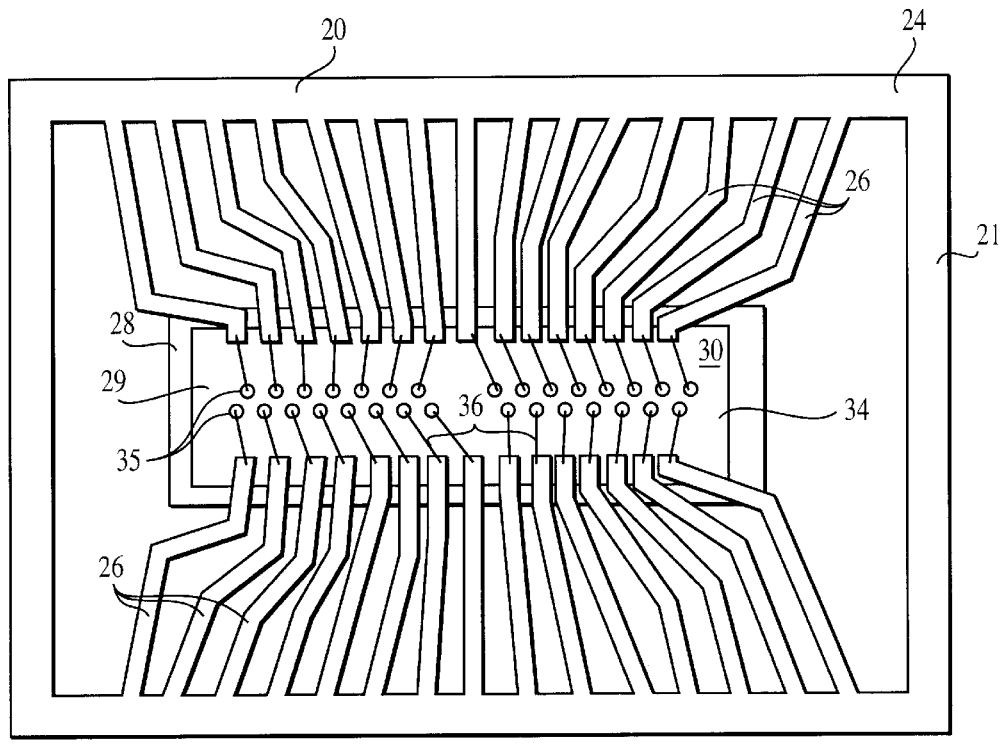
Figure 3D:
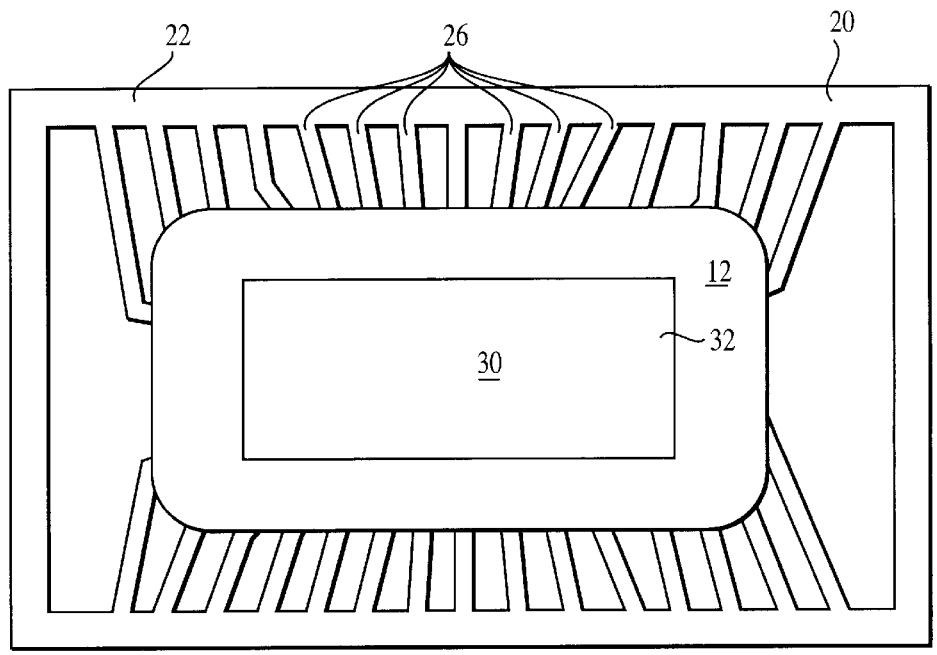

FIGS. 3A–3D and 4 illustrate the method of manufacturing the semiconductor package 10. Although FIGS. 3A–3C only show the lead frame 20 in various stages of fabrication (and not the lead frame 40), it is to be understood that the lead frame 40 is similarly fabricated, and the following description of the fabrication of the lead frame 20 is equally applicable to the fabrication of lead frame 40. As shown in FIG. 3A, a lead frame 20 is provided with an outer boundary 21 and inwardly extending fingers 26. A second lead frame 40 is likewise provided with an outer boundary and inwardly extending fingers 46. The positioning of the fingers 26 in FIGS. 3A–3D is merely illustrative, and it is to be understood that the fingers may form any configuration suitable for supporting a semiconductor die on a layer of tape.

Figure 4:
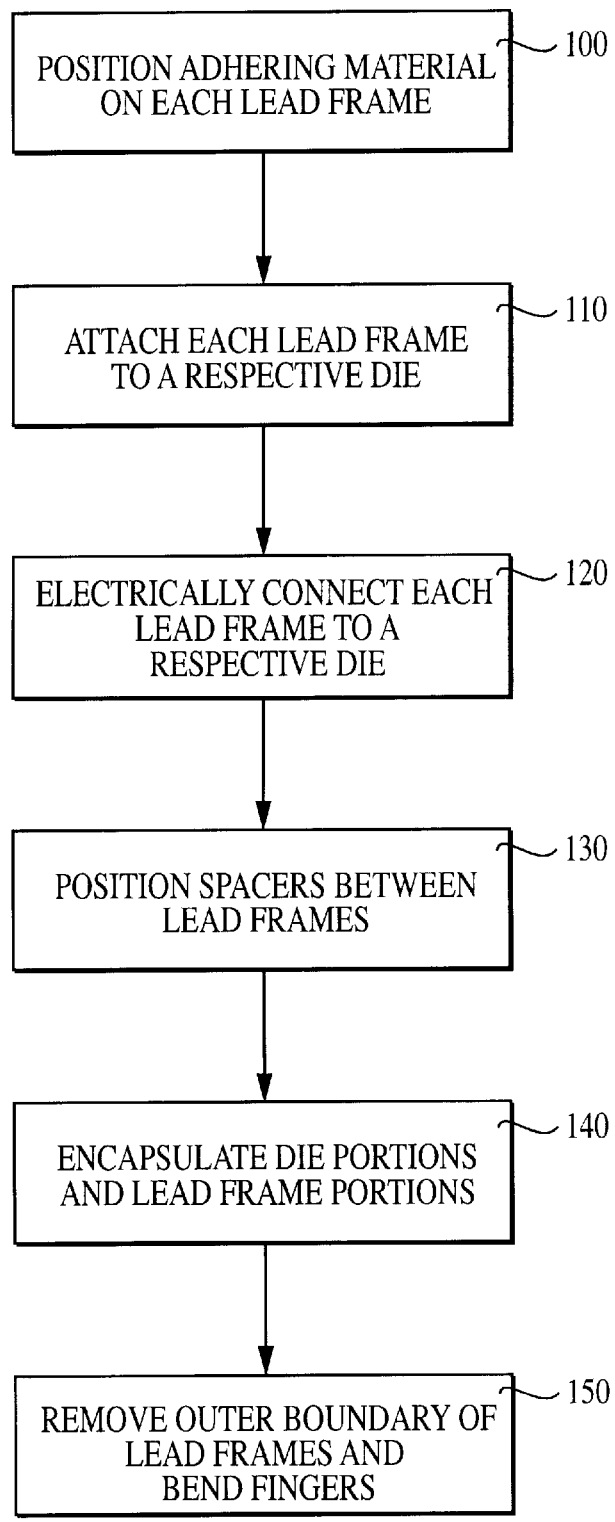
FIG. 4 is flow chart of steps used in manufacturing the semiconductor package of FIG. 1.

An adhering material, such as tape 28, is positioned on the lead frame 20 at step 100 (FIG. 4). Specifically, as shown in FIG. 3B the tape 28 is positioned within the outer boundary 21 and in contact with the fingers 26. The semiconductor die 30 is then attached to the tape 28 at step 110 such that the inner surface 34 contacts the tape 28. The semiconductor die 30 is so placed to allow electrical connection between its bond pads 35 and the fingers 26 through the cavity 29. The electrical connectors 36 are then wire bonded between the fingers 26 and the bond pads 35 at step 120 (FIG. 3C).

At step 130, the spacers 38 are positioned between the lead frames 20, 40. Alternatively, the spacers 38 could be pre-applied to one or both of the lead frames 20. 40. In particular, the spacers 38 are positioned between the inner surfaces 24 and 44 of, respectively, the lead frames 20 and 40 (FIG. 2). All portions of the semiconductor dies 30, 50 with the exception of the exposed surfaces 32, 52 are then encapsulated at step 140 with the molded plastic material 12. Thus, the surfaces 32, 52 remain exposed and provide a heat dissipating surface. Further, portions of the fingers 26, 46 are encapsulated within the molded plastic material 12, leaving other finger portions exposed for providing electrical connection to circuit boards or sockets.

The spacers 38 keep open the cavity 60 which allows unfettered electrical connection between the bond pads 35 and the fingers 26. The cavity 60, and hence the electrical connectors 36 and the bond pads 35 are encased within the molded plastic material 12, which protects them against damage from corrosion and/or shock. With improvements in handling technology and encapsulation process technology, it may be possible to eliminate the spacers 38 completely.

The process for encapsulating the dies 30, 50 in the molded plastic material 12 is well known in the industry, and it may include placing the dies 30, 50 and their associated lead frames in a heated cavity and injecting the molded plastic material 12 in a semi-liquid or gel state into the heared cavity. The molded plastic material 12 then cures and hardens.

At step 150, the outer boundary 21 of the lead frame 20 and the outer boundary of the lead frame 40 are removed to expose ends of the fingers 26 and 46 which are protruding from the molded plastic material 12. The exposed ends of the fingers 26 ad 46 may then be bent to provide leads for contacting the package 10 to a printed circuit board, socket or other mounting structure (not shown). Depending on the circuitry within the dies 30, 50, one or more of the fingers 26 and 46 may be connected together or may be left separated.

One advantage in stacking a pair of semiconductor dies as illustrated in FIGS. 1–2 is that such a semiconductor package 10 retains essentially the same thickness, configuration, and package outline as single die packages. Preferably, the semiconductor package 10 has a thickness T (FIG. 2) in the range of between about 1.175 millimeters and 1.26 millimeters. By retaining the same outline, the semiconductor package 10 can be tested using existing tools used for testing single die packages. Another advantage of the semiconductor package 10 is that leaving the surfaces 32, 52 exposed decreases package thickness while providing good heat dissipation. Another advantage is that the exposed surfaces 32, 52 each provide a surface upon which identifying marks and/or alphanumeric symbols may be formed.

Figure 5:
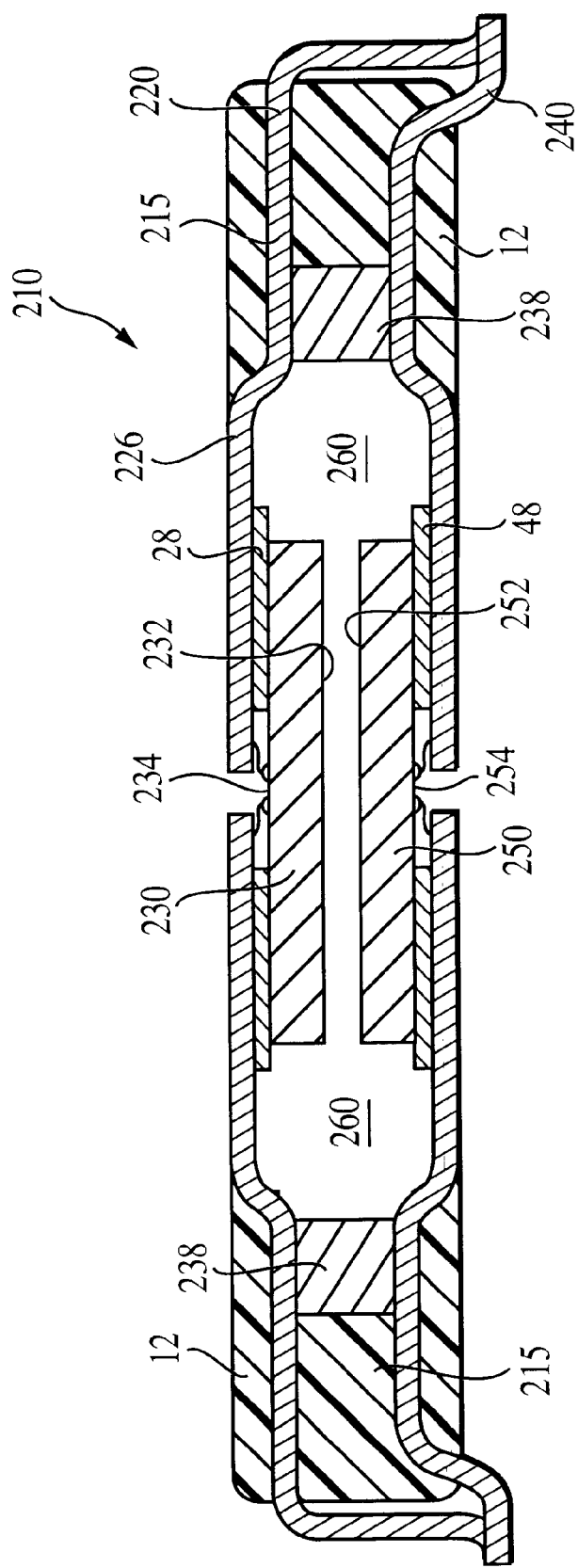
FIG. 5 is a cross-sectional view of a high density semiconductor package constructed in accordance with another embodiment of the invention.

An alternative embodiment of a high density semiconductor package is illustrated in FIG. 5. A semiconductor package 210 is shown including a first lead frame 220, a second lead frame 240, a first semiconductor die 230, and a second semiconductor die 250. The first semiconductor die 230 is attached to the first lead frame 220, and the second semiconductor die 250 is attached to the second lead fame 240. As with the semiconductor package 10, the semiconductor package 210 has a thickness T in the range of between about 1.175 millimeters and 1.26 millimeters.

The first semiconductor die 230 includes a pair of opposing surfaces 232, 234. The first surface 232 remains uncovered, while a portion of the second surface 234 contacts the adhering material 28 to attach the first semiconductor die 230 to the first lead frame 220, and another portion of the second surface 234 is exposed. Likewise, the second semiconductor die 250 includes a pair of surfaces 252, 254. The surface 252 remains uncovered, while a portion of the other surface 254 contacts the adhering material 48 to attach the second semiconductor die 250 to the second lead frame 240, and another portion of the other surface 254 is exposed. In the FIG. 5 embodiment, heat dissipation of the semiconductor package 210 occurs through the exposed fingers 226, 246 of the lead frames 220, 240.

A pair of spacers 238 separate the two lead frames 220 and 240, providing a cavity 260 therebetween. Tab bonds connect bonding sites on the surface 234 of the first semiconductor die 230 to the first lead frame 220, and tab bonds connect bonding sites on the surface 254 of the second semiconductor die 250 to the second lead frame 240. Finally, the encapsulating molded plastic material 12 encapsulates a periphery 215 of the package 210.

Figure 6:
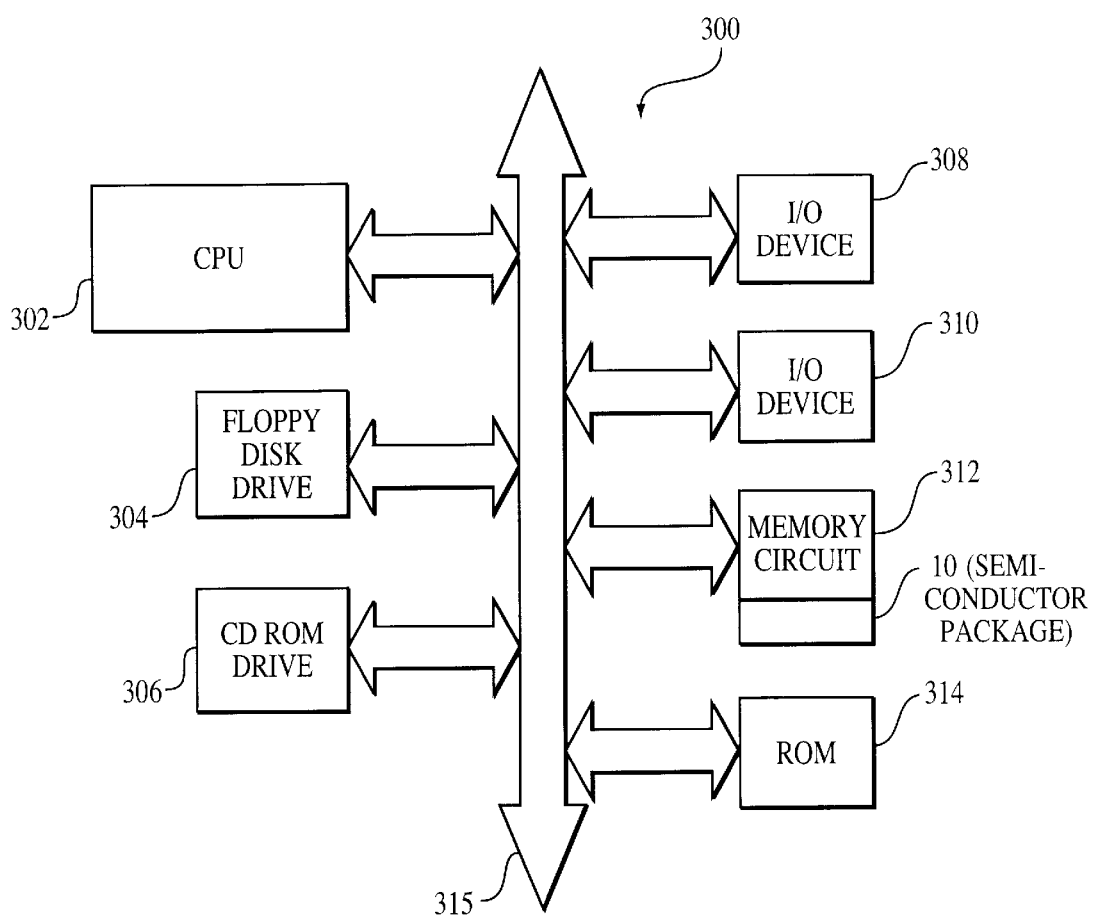
FIG. 6 illustrates a processor-based system constructed in accordance with an embodiment of the present invention.

Referring now to FIG. 6, a device constructed in accordance with the invention can be used in a memory circuit, such as a DRAM device 312, or other electronic integrated circuit, such as a central processing unit (CPU) 302, within a processor-based system 300. The processor-based system 300 may be a computer system, a process control system or any other system employing a processor and associated memory. The system 300 includes the central processing unit (CPU) 302, which may be a microprocessor. The CPU 302 communicates with the DRAM device 312, one or both of which includes the semiconductor package of the invention, over a bus 315. The CPU 302 further communicates with one or more I/O devices 308. 310 over the bus 315. Although illustrated as a single bus, the bus 315 may be a series of buses and bridges commonly used in a processor-based system. Further components of the system 300 may include a read only memory (ROM) device 314, which may also employ the semiconductor package of the invention, and peripheral devices such as a floppy disk drive 304, and CD-ROM drive 306. The floppy disk drive 304 and CD-ROM drive 306 communicate with the CPU 302 over the bus 315.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor package, comprising:
   a first die support structure;
   a second die support structure connected to said first die support structure;
   a first and a second semiconductor die, each said die being supported by a respective one of said first and second die support structures; and
   an encapsulating material for encapsulating at least portions of said first and second dies and first and second support structures in a manner which leaves other portions of said die support structures and said dies exposed as heat dissipating surfaces.

2. The semiconductor package of claim 1, wherein said die support structures comprise first and second lead frames, each said lead frame including a plurality of fingers.

3. The semiconductor package of claim 1, wherein said other portions of said dies are exposed to provide said heat dissipating surfaces.

4. The semiconductor package of claim 1, wherein said other portions of said die support structures are exposed to provide said heat dissipating surfaces.

5. The semiconductor package of claim 3 or 4, wherein said semiconductor dies are attached to said fingers of respective lead frames.

6. The semiconductor package of claim 5, further comprising an adhering material positioned between a said semiconductor die and a respective lead frame.

7. The semiconductor package of claim 6, wherein said adhering material comprises a tape.

8. The semiconductor package of claim 7, further comprising a cavity between said first and second lead frames.

9. The semiconductor package of claim 8, wherein said second surfaces of said first and second semiconductor dies face each other within said cavity.

10. The semiconductor package of claim 9, further comprising a cavity between said first and second lead frames, wherein said semiconductor dies each have respective surfaces which face each other within said cavity.

11. The semiconductor package of claim 2, further comprising at least one spacer positioned between said first and second lead frames.

12. The semiconductor package of claim 2, further comprising bonding sites on said fingers and bonding sites on said semiconductor dies, wherein each said bonding site on said first semiconductor die is electrically connected to a respective said bonding site on said first lead frame fingers and each said bonding site on said second semiconductor die is electrically connected to a respective said bonding site on said second lead frame fingers.

13. The semiconductor package of claim 1, wherein the package has a thickness no greater than about 1.26 millimeters.

14. The semiconductor package of claim 13, wherein the package has a thickness in the range of about 1.175 millimeters and about 1.26 millimeters.

15. A processor-based system, comprising:
   a processing unit; and
   an integrated circuit structure coupled to said processing unit, at least one of said processing unit and integrated circuit structure having a semiconductor package which comprises:
   a first die support structure;
   a second die support structure connected to said first die support structure;
   a first and a second semiconductor die, each said die being supported by a respective one of said first and second die support structures; and
   an encapsulating material for encapsulating at least portions of said first and second dies and first and second support structures in a manner which leaves other portions of said die support structures and said dies exposed as heat dissipating surfaces.

16. The system of claim 15, wherein said die support structures comprise first and second lead frames, each said lead frame including a plurality of fingers.

17. The system of claim 15, wherein said other portions of said dies are exposed to provide said heat dissipating surfaces.

18. The system of claim 15, wherein said other portions of said die support structures are exposed to provide said heat dissipating surfaces.

19. The system of claim 17 or 18, wherein said semiconductor dies are attached to said fingers of respective lead frames.

20. The system of claim 19, further comprising an adhering material positioned between a said semiconductor die and a respective lead frame.

21. The system of claim 20, wherein said adhering material comprises a tape.

22. The system of claim 21, further comprising a cavity between said first and second lead frames.

23. The system of claim 22, wherein said second surfaces of said first and second semiconductor dies face each other within said cavity.

24. The system of claim 23, further comprising a cavity between said first and second lead frames, wherein said semiconductor dies each have respective surfaces which face each other within said cavity.

25. The system of claim 16, further comprising at least one spacer positioned between said first and second lead frames.

26. The system of claim 16, further comprising bonding sites on said fingers and bonding sites on said semiconductor dies, wherein each said bonding site on said first semiconductor die is electrically connected to a respective said bonding site on said first lead frame fingers and each said bonding site on said second semiconductor die is electrically connected to a respective said bonding site on said second lead frame fingers.

27. The system of claim 15, wherein the package has a thickness no greater than about 1.26 millimeters.

28. The system of claim 27, wherein the package has a thickness in the range of about 1.175 millimeters and about 1.26 millimeters.

* * * * *

UNITED STATES PATENT AND TRADEMARK OFFICE
CERTIFICATE OF CORRECTION

PATENT NO. : 6,541,856 B2
DATED : April 1, 2003
INVENTOR(S) : David J. Corisis et al.

It is certified that error appears in the above-identified patent and that said Letters Patent is hereby corrected as shown below:

Column 1,
Line 18, change "arc" to -- are --.

Signed and Sealed this

Tenth Day of June, 2003

JAMES E. ROGAN
*Director of the United States Patent and Trademark Office*